United States Patent
Ricci et al.

(10) Patent No.: US 9,728,429 B2
(45) Date of Patent: Aug. 8, 2017

(54) PARASITIC PLASMA PREVENTION IN PLASMA PROCESSING CHAMBERS

(75) Inventors: Anthony Ricci, Sunnyvale, CA (US); Saurabh Ullal, Union City, CA (US); Larry Martinez, Gilroy, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 737 days.

(21) Appl. No.: 12/844,527

(22) Filed: Jul. 27, 2010

(65) Prior Publication Data

US 2012/0024449 A1    Feb. 2, 2012

(51) Int. Cl.

| | |
|---|---|
| *C23C 16/50* | (2006.01) |
| *C23C 16/00* | (2006.01) |
| *C23F 1/00* | (2006.01) |
| *H01L 21/306* | (2006.01) |
| *H01L 21/67* | (2006.01) |
| *C23C 16/44* | (2006.01) |
| *H01J 37/32* | (2006.01) |
| *H01L 21/683* | (2006.01) |

(52) U.S. Cl.
CPC .... *H01L 21/67069* (2013.01); *C23C 16/4404* (2013.01); *H01J 37/32477* (2013.01); *H01J 37/32798* (2013.01); *H01L 21/6833* (2013.01); *Y10T 156/10* (2015.01)

(58) Field of Classification Search
USPC ........ 118/715, 728–733; 156/345.51–345.55
See application file for complete search history.

(56) References Cited

U.S. PATENT DOCUMENTS

| | | | |
|---|---|---|---|
| 4,340,462 A | 7/1982 | Koch | |
| 4,608,983 A | 9/1986 | Müller et al. | |
| 4,948,458 A | 8/1990 | Ogle | |
| 4,963,713 A * | 10/1990 | Horiuchi et al. | ........ 219/121.43 |
| 5,129,359 A * | 7/1992 | Takei | .............. C23C 16/455 |
| | | | 118/723 MP |
| 5,200,232 A | 4/1993 | Tappan et al. | |
| 5,423,971 A | 6/1995 | Arnold et al. | |
| 5,748,663 A | 5/1998 | Chenausky | |
| 5,796,066 A | 8/1998 | Guyot | |
| 5,800,618 A * | 9/1998 | Niori et al. | .............. 118/723 E |
| 5,820,723 A | 10/1998 | Benjamin et al. | |
| 5,824,605 A | 10/1998 | Chen et al. | |

(Continued)

FOREIGN PATENT DOCUMENTS

| | | |
|---|---|---|
| CN | 1407613 A | 4/2003 |
| CN | 1941318 A | 4/2007 |

(Continued)

OTHER PUBLICATIONS

Definition of Bonding, from Google Search. Source: https://www.google.com/#q=define+bonding. Retrieved Jun. 20, 2016.*

(Continued)

*Primary Examiner* — Karla Moore
*Assistant Examiner* — Tiffany Nuckols (57) ABSTRACT

Parasitic plasma in voids in a component of a plasma processing chamber can be eliminated by covering electrically conductive surfaces in an interior of the voids with a sleeve. The voids can be gas holes, lift pin holes, helium passages, conduits and/or plenums in chamber components such as an upper electrode and a substrate support.

15 Claims, 5 Drawing Sheets

(56) References Cited

U.S. PATENT DOCUMENTS

| | | | |
|---|---|---|---|
| 5,885,423 A | 3/1999 | Guyot | |
| 5,886,863 A * | 3/1999 | Nagasaki | H01L 21/6831 |
| | | | 279/128 |
| 5,948,704 A | 9/1999 | Benjamin et al. | |
| 5,959,409 A * | 9/1999 | Dornfest | H01J 37/32495 |
| | | | 118/723 E |
| 6,013,155 A | 1/2000 | McMillin et al. | |
| 6,073,577 A * | 6/2000 | Lilleland | H01J 37/32009 |
| | | | 118/723 E |
| 6,090,304 A | 7/2000 | Zhu et al. | |
| RE36,810 E * | 8/2000 | Arasawa | C23C 16/4586 |
| | | | 156/345.27 |
| 6,108,189 A | 8/2000 | Weldon et al. | |
| 6,140,612 A | 10/2000 | Husain et al. | |
| 6,178,919 B1 | 1/2001 | Li et al. | |
| 6,230,651 B1 | 5/2001 | Ni et al. | |
| 6,263,829 B1 | 7/2001 | Schneider et al. | |
| 6,333,272 B1 | 12/2001 | McMillin et al. | |
| 6,506,685 B2 | 1/2003 | Li et al. | |
| 6,581,275 B2 | 6/2003 | Narendrnath et al. | |
| 6,583,538 B1 | 6/2003 | Adolf et al. | |
| 6,606,234 B1 | 8/2003 | Divakar | |
| 6,824,627 B2 | 11/2004 | Dhindsa et al. | |
| 6,847,014 B1 | 1/2005 | Benjamin et al. | |
| 6,847,516 B2 | 1/2005 | Kwon et al. | |
| 6,921,724 B2 * | 7/2005 | Kamp et al. | 438/715 |
| 6,974,523 B2 | 12/2005 | Benzing et al. | |
| 7,084,063 B2 | 8/2006 | Noguchi et al. | |
| 7,161,121 B1 | 1/2007 | Steger | |
| 7,699,957 B2 | 4/2010 | Lee et al. | |
| 2002/0135969 A1* | 9/2002 | Weldon et al. | 361/234 |
| 2005/0028935 A1* | 2/2005 | Wickramanayaka | H01J 37/3244 |
| | | | 156/345.34 |
| 2005/0105243 A1* | 5/2005 | Lee et al. | 361/234 |
| 2006/0075969 A1* | 4/2006 | Fischer | 118/725 |
| 2006/0278254 A1 | 12/2006 | Jackson | |
| 2007/0089672 A1 | 4/2007 | Shimamura et al. | |
| 2007/0119370 A1* | 5/2007 | Ma | C23C 16/18 |
| | | | 118/723 E |
| 2007/0144891 A1 | 6/2007 | Henrich et al. | |
| 2007/0160507 A1* | 7/2007 | Satoh et al. | 422/135 |
| 2007/0264443 A1 | 11/2007 | Choi et al. | |
| 2008/0083736 A1* | 4/2008 | Steger et al. | 219/494 |
| 2008/0230181 A1* | 9/2008 | Higuma et al. | 156/345.51 |
| 2008/0254220 A1* | 10/2008 | Tian | H01J 37/32192 |
| | | | 427/271 |
| 2009/0002913 A1 | 1/2009 | Naim | |
| 2009/0022905 A1 | 1/2009 | Kudela et al. | |
| 2009/0034147 A1 | 2/2009 | Narendrnath et al. | |
| 2009/0151636 A1 | 6/2009 | White et al. | |
| 2009/0169726 A1* | 7/2009 | Fujii et al. | 427/77 |
| 2009/0233443 A1* | 9/2009 | Sasaki | H01L 21/68 |
| | | | 438/689 |
| 2009/0243236 A1* | 10/2009 | Hida | H01L 21/6831 |
| | | | 279/128 |
| 2009/0324847 A1 | 12/2009 | Choi et al. | |
| 2010/0101728 A1* | 4/2010 | Iwasaki | H01J 37/32192 |
| | | | 156/345.33 |
| 2010/0314599 A1 | 12/2010 | Kikuchi et al. | |
| 2011/0287631 A1* | 11/2011 | Yamamoto | H01J 37/32568 |
| | | | 438/710 |

FOREIGN PATENT DOCUMENTS

| | | |
|---|---|---|
| TW | 200822281 A | 5/2008 |
| TW | 200921838 A | 5/2009 |
| TW | 201004485 A | 1/2010 |

OTHER PUBLICATIONS

International Search Report and Written Opinion mailed Jan. 18, 2012 for PCT/US2011/001270.

Notice of Reason for Refusal dispatched May 7, 2015 for Japanese Patent Appln. No. 2013-521760.

Notification of Examination Opinions corresponding to Taiwanese Patent Application No. 100124043, issued on Feb. 25, 2016; 8 pages.

* cited by examiner

PARASITIC PLASMA PREVENTION IN PLASMA PROCESSING CHAMBERS

BACKGROUND

With each successive semiconductor technology generation, wafer diameters tend to increase and transistor sizes decrease, resulting in the need for an ever higher degree of accuracy and repeatability in substrate processing. Semiconductor substrate materials, such as silicon wafers, are routinely processed using plasma in vacuum chambers. Plasma processing techniques include sputter deposition, plasma-enhanced chemical vapor deposition (PECVD), resist strip, and plasma etch.

In a plasma processing chamber, process gas is excited into a plasma in a proximity of a substrate being processed. However, gas at other locations (such as gas holes, conduits, lift pin holes, plenums, and the like) in the plasma processing chamber can also be excited into an unwanted plasma under certain conditions. Such an unwanted plasma is called parasitic plasma. Parasitic plasma can occur in a plasma processing chamber due to many reasons, such as geometry of chamber components, gas pressure and gas chemistry used in plasma processing recipes, supply of radio frequency (RF) power, etc. Parasitic plasma can cause a variety of issues in plasma processing, such as particle contamination, spatial and temporal nonuniformity during processing, and/or premature failure of chamber components. It is therefore desirable to eliminate parasitic plasma in a plasma processing chamber.

SUMMARY

Described herein is a component of a plasma processing chamber, comprising: a first layer of a non-metal material, the first layer having first and second opposing surfaces, the first surface exposed to plasma in the plasma processing chamber and the second surface not exposed plasma in the plasma processing chamber; a second layer of an electrically conductive material, the second layer bonded to the second surface of the first layer; a void space extending through the entire first and second layers; a tubular sleeve lining an interior surface of the void space in the second layer such that the second layer is not exposed in the void space and parasitic plasma can be prevented in the void space; wherein one end of the tubular sleeve is coplanar with facing surfaces of the first layer and the second layer and the other end of the tubular sleeve is coplanar with a lower surface of the second layer.

DETAILED DESCRIPTION

Described herein is a method and components of a plasma processing chamber for eliminating parasitic plasma. The method and components are not limited to a particular type of plasma processing chamber or a particular plasma processing technique. A plasma processing chamber can rely on a variety of mechanisms to generate plasma, such as inductive coupling (transformer coupling), helicon, electron cyclotron resonance, capacitive coupling (parallel plate). For instance, high density plasma can be produced in a transformer coupled plasma (TCP™) processing chamber, or in an electron cyclotron resonance (ECR) processing chamber. Transformer coupled plasma processing chambers, wherein RF energy is inductively coupled into the chambers, are available from Lam Research Corporation, Fremont, Calif. An example of a high-flow plasma processing chamber that can provide high density plasma is disclosed in commonly-owned U.S. Pat. No. 5,948,704, the disclosure of which is hereby incorporated by reference. Parallel plate plasma processing chambers, electron-cyclotron resonance (ECR) plasma processing chambers, and transformer coupled plasma (TCP™) processing chambers are disclosed in commonly-owned U.S. Pat. Nos. 4,340,462; 4,948,458; 5,200,232 and 5,820,723, the disclosures of which are hereby incorporated by reference.

By way of example, plasma can be produced in a parallel plate processing chamber such as the dual frequency plasma etching chamber described in commonly-owned U.S. Pat. No. 6,090,304, the disclosure of which is hereby incorporated by reference. A preferred parallel plate plasma processing chamber is a dual frequency capacitively coupled plasma processing chamber including an upper showerhead electrode and a substrate support. For purposes of illustration, embodiments herein are described with reference to a parallel plate type plasma processing chamber.

Figure 1:
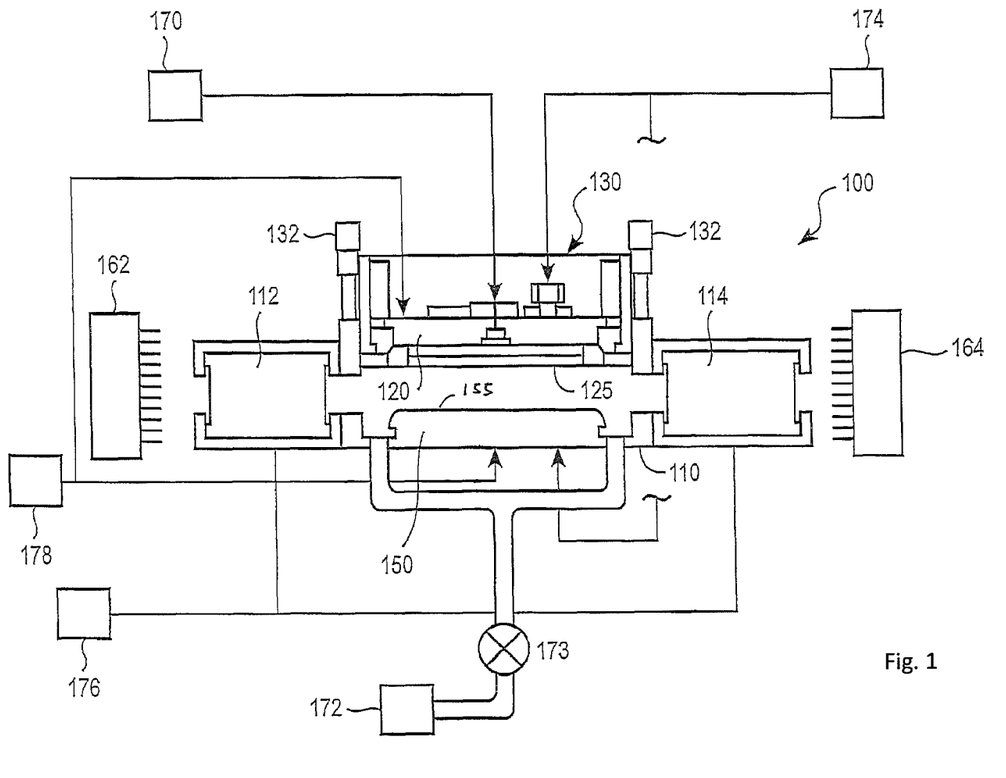
FIG. 1 shows a schematic of an exemplary plasma processing chamber.

A parallel plate plasma processing chamber for plasma etching is illustrated in FIG. 1. The plasma processing chamber 100 comprises a chamber 110, an inlet load lock 112, and an optional outlet load lock 114, further details of which are described in commonly-owned U.S. Pat. No. 6,824,627, which is hereby incorporated by reference in its entirety.

The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber 110. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma processing chamber, such as a parallel plate plasma processing chamber, preferably the chamber pressure is maintained at a pressure below about 200 mTorr (e.g., less than 100 mTorr such as 20 to 50 mTorr) ("about" as used herein means±10%).

The vacuum pump 172 can be connected to an outlet in a wall of the chamber 110 and can be throttled by a valve 173 in order to control the pressure in the chamber. Preferably, the vacuum pump is capable of maintaining a pressure within the chamber 110 of less than 200 mTorr while etching gases are flowed into the chamber 110.

The chamber 110 includes an upper electrode assembly 120 including an upper electrode 125 (e.g., showerhead electrode), and a substrate support 150. The upper electrode assembly 120 is mounted in an upper housing 130. The upper housing 130 can be moved vertically by a mechanism 132 to adjust the gap between the upper electrode 125 and the substrate support 150.

A process gas source 170 can be connected to the housing 130 to deliver process gas comprising one or more gases to the upper electrode assembly 120. In a preferred plasma processing chamber, the upper electrode assembly comprises a gas distribution system, which can be used to deliver process gas to a region proximate to the surface of a substrate. Gas distribution systems, which can comprise one or more gas rings, injectors and/or showerheads (e.g., showerhead electrodes), are disclosed in commonly-owned U.S. Pat. Nos. 6,333,272; 6,230,651; 6,013,155 and 5,824,605, the disclosures of which are hereby incorporated by reference.

The upper electrode 125 preferably comprises a showerhead electrode, which includes gas holes (not shown) to distribute process gas therethrough. The gas holes can have a diameter of 0.02 to 0.2 inch. The showerhead electrode can comprise one or more vertically spaced-apart baffle plates that can promote the desired distribution of process gas. The upper electrode and the substrate support may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the substrate support 150.

The substrate support 150 can have one or more embedded clamping electrodes for electrostatically clamping a substrate on an upper surface 155 (support surface) of the substrate support 150. The substrate support 150 can be powered by an RF source and attendant circuitry (not shown) such as RF matching circuitry. The substrate support 150 is preferably temperature controlled and may optionally include a heating arrangement (not shown). Examples of heating arrangements are disclosed in commonly assigned U.S. Pat. Nos. 6,847,014 and 7,161,121, which are hereby incorporated by reference. The substrate support 150 can support a semiconductor substrate such as a flat panel or 200 mm or 300 mm wafer on the support surface 155.

The substrate support 150 preferably includes passages therein for supplying a heat transfer gas such as helium under the substrate supported on the support surface 155 to control the substrate temperature during plasma processing thereof. For example, helium back cooling can maintain wafer temperature low enough to prevent burning of photoresist on the substrate. A method of controlling a temperature of a substrate by introducing a pressurized gas into a space between the substrate and the substrate support surface is disclosed in commonly-owned U.S. Pat. No. 6,140,612, the disclosure of which is hereby incorporated by reference.

The substrate support 150 can include lift pin holes (not shown), through which lift pins can be actuated vertically by suitable mechanisms and raise the substrate off the support surface 155 for transport into and out from the chamber 110. The lift pin holes can have a diameter of about 0.08 inch. Details of lift pin holes are disclosed in commonly owned U.S. Pat. Nos. 5,885,423 and 5,796,066, the disclosure of which is hereby incorporated by reference.

Void spaces such as the gas holes, helium passages, lift pin holes in the upper electrode 125 and the substrate support 150 can be prone to parasitic plasma. For example, if a void space extends across layers of materials with different relative permittivity at RF frequencies, excessive RF voltage can occur between the layers, under certain conditions (e.g. gas pressure, RF load, RF frequency, etc.). Such excessive RF voltage (e.g. 20 V or more) can be sufficient to cause parasitic plasma in the void space. Electrically conductive materials commonly used in the upper electrode 125 and the substrate support 150 can include aluminum, steel, graphite, and doped silicon. Exposed conductive interior surfaces of the void space (e.g. of gas holes) can concentrate electric fields and intensify parasitic plasma in their proximity, when RF power is supplied to the processing chamber 100 to generate plasma therein. DC breakdown voltage $V_B$ of a gas in parallel plates as a function of pressure p and gap distance d is given by the Paschen $$\text{equation } V_1 B = Bpd / (\ln(Apd) / \ln[(1/\gamma)])$$

$$V_B = Bpd \cdot \frac{\ln(1/\gamma)}{\ln(Apd)},$$

where A and B are constants determined by the properties of the gas (e.g., temperature, gas composition and ionization potential) and $\gamma$ is a parameter related to materials of the parallel plates. AC breakdown voltage can be as little as one tenth of $V_B$, especially in the vicinity of conductive surfaces that are exposed to the gas and concentrated electric fields.

Figure 2:
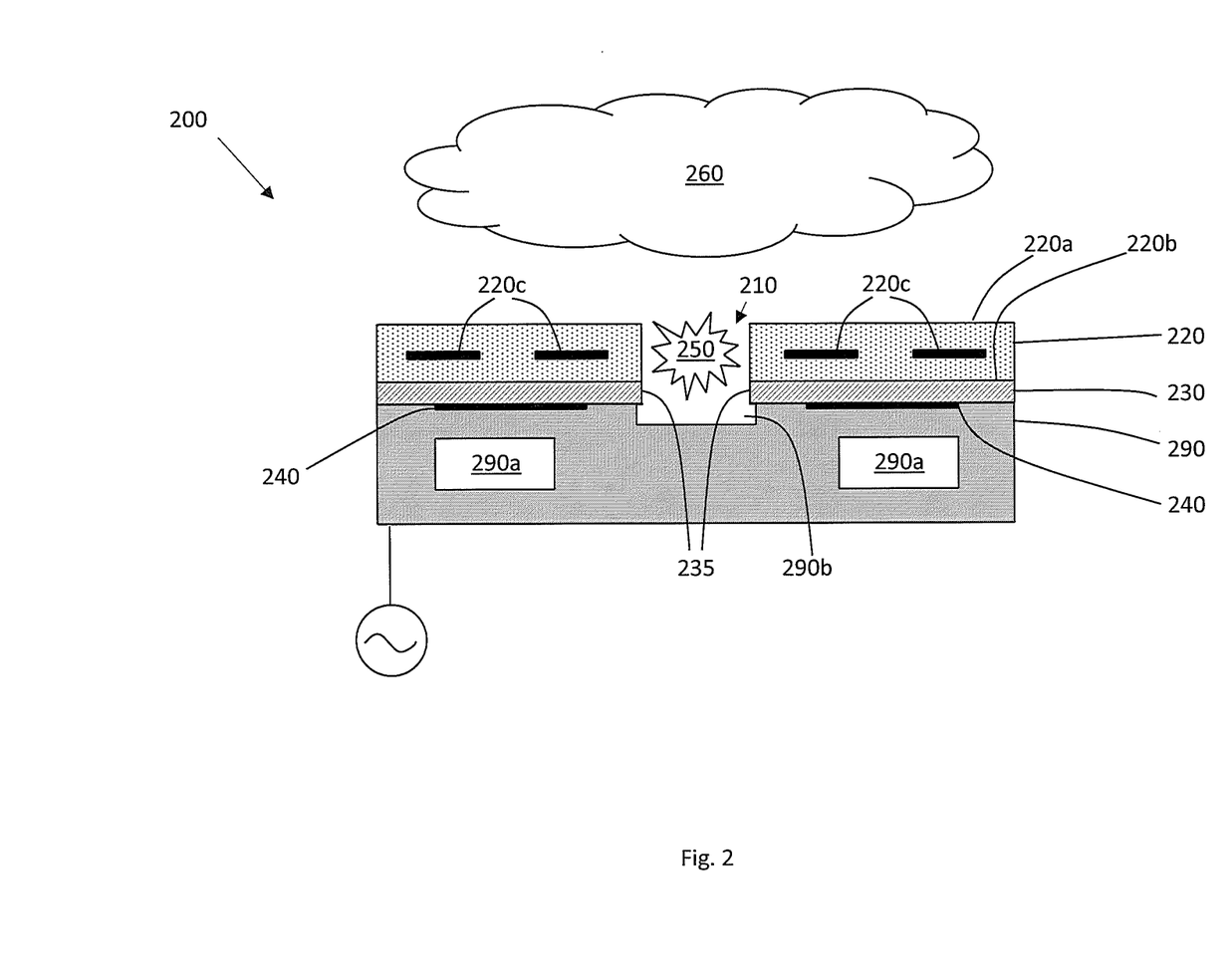
FIG. 2 shows a cross sectional view of a component of a plasma processing chamber, the component having a void space.

FIG. 2 shows a cross sectional diagram of a void space 210 in a component 200 (e.g. an upper electrode or a substrate support) of a plasma processing chamber. The component 200 comprises a layer 220 of a non-metal material (e.g. ceramic or undoped silicon), a layer 230 of an electrically conductive material (e.g. aluminum). The layer 220 has a surface 220a exposed to plasma 260 in the plasma processing chamber and a surface 220b not exposed to plasma 260. The layer 230 can be bonded to the surface 220b using a suitable technique such as using an adhesive (e.g. silicone rubber). Each void space 210 extends through the entire layer 220 and the entire layer 230 and is open to an interior of the plasma processing chamber. The thickness of the layer 220 and the thickness of the layer 230 are preferably from 0.5 to 5 mm respectively. The void space 210 can be about 0.02 to about 0.08 inch in diameter. The layer 220 can be made of, for example, alumina, aluminum nitride, undoped silicon, silicon nitride, silicon oxide, silicon oxynitride and/or yttria. The layer 230 can be made of, for example, metal, graphite and/or doped silicon. The layer 230 has a conductive surface 235 exposed in an interior of the void space 210. Parasitic plasma 250 can occur in the interior of the void space 210 and cause erosion and/or corrosion therein. The component 200 can be attached (such as bonded, supported, fastened and/or adhered) to a base 290. The base can be temperature controlled, for example, by flowing liquid through embedded fluid channels 290a therein. The base can also have at least one plenum 290b in fluid communication with the void 210. RF power can be supplied to the base 290 to generate the plasma 260. The layer 220 can have at least one electrostatic chuck (ESC) electrode 220c embedded therein. At least one heater 240

(e.g. thin film heater) is preferably in thermal contact with (e.g. attached to a bottom surface of or embedded in) the layer 230. Preferably, a relative permittivity of the electrical conductive material of layer 230 at radio frequencies present in the plasma processing chamber is at least 20 times greater than a relative permittivity of the non-metal material of layer 220 at the radio frequencies. In an example, wherein the void space 210 is filled with helium gas at 30 Torr; the layer 220 is approximately 0.1 inch thick; the layer 230 is bonded to the layer 220 with an adhesive layer of approximately 0.03 inch thick; the component is subject to RF power of 2500 W at 27 MHz; and the plasma 260 has an impedance of approximately 60Ω, an RF potential of approximately 15.5 V will develop between the layer 230 and the surface 220a, which can exceed the breakdown voltage of the helium gas in the void space 210 and cause parasitic plasma 250 therein.

Figure 3:
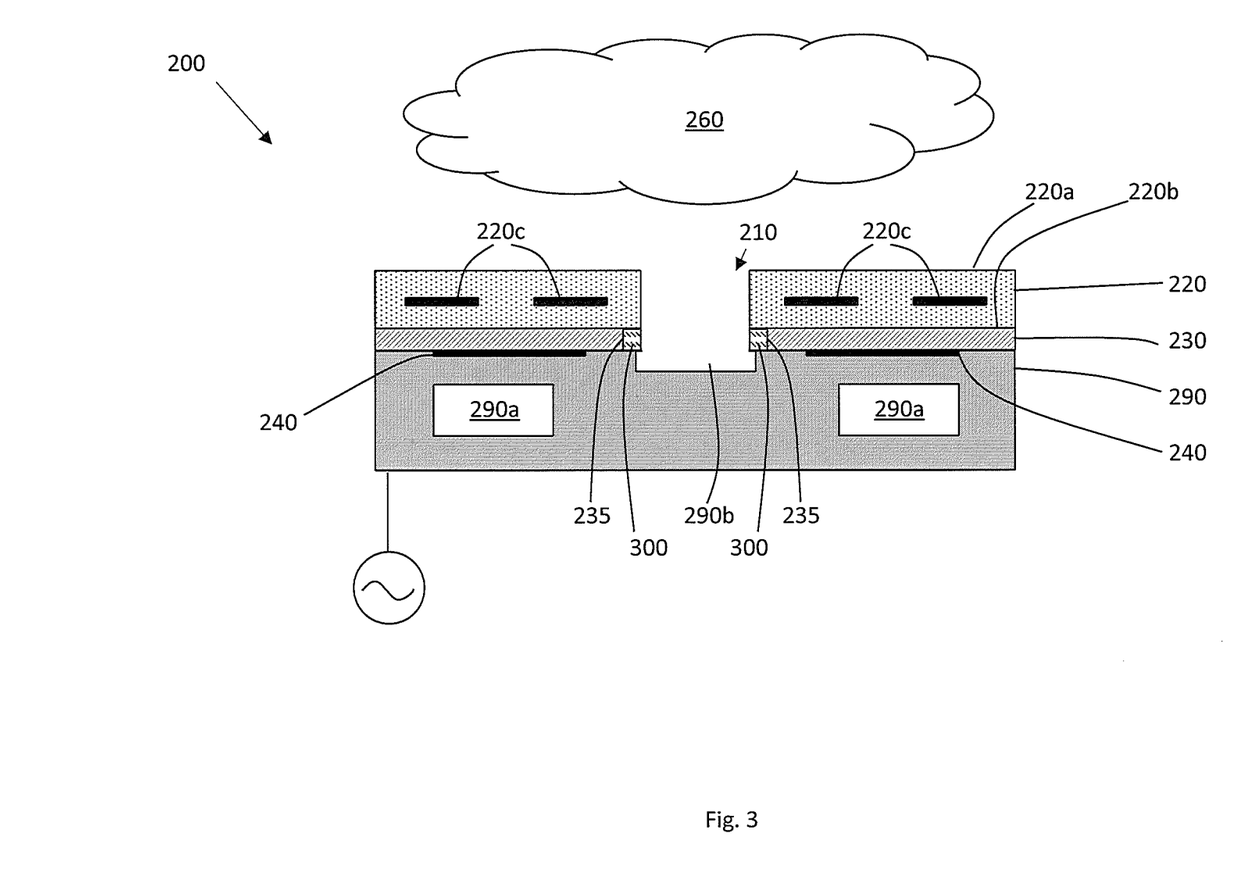
FIG. 3 shows a cross sectional view of a component of a plasma processing chamber, the component having a void space with a sleeve lining an interior surface thereof, according to a first embodiment.

In one embodiment, as shown in FIG. 3, a tubular sleeve 300 lines an interior surface of the void space 210. The sleeve 300 is preferably made of a material with a dielectric constant lower than that of the layer 230, such as plastic (e.g. polyether ether ketone) or ceramic (e.g. alumina). Preferably, the portion of the void space 210 in layer 220 has the same cross sectional shape (e.g. circle, polygon or any other suitable shape) as the passage through the sleeve 300. The void space 210 can be in the shape of a cylinder or a prism. Specifically, if the void space 210 is cylindrical in shape, the tubular sleeve 300 has an inner diameter equal to an inner diameter of the void space 210 in the layer 220. The radial thickness of the sleeve 300 should be sufficient to suppress parasitic plasma in the void space 210, preferably at least 0.01 inch. Preferably, the sleeve 300 is made of the same material as the layer 220 and is not directly exposed to the plasma 260. The sleeve 300 preferably has one end coplanar with an upper surface of layer 230 and the other end of the sleeve 300 is preferably coplanar with a lower surface of layer 230 such that the conductive surface 235 of the layer 230 is entirely covered by the sleeve 300, i.e. no conductive surface is exposed in the void space 210. Preferably, the sleeve 300 does not extend into the base 290.

The sleeve 300 can be a self-supporting sleeve affixed to the component 200 by any suitable means, such as adhesive, press fitting or the like. However, the sleeve 300 can have threads on its exterior surface that mate with threads in the laminate 200. The sleeve 300 can also be in a form of a coating applied on the interior surface of the void space 210 by any suitable coating means. For example, CVD, plasma spraying.

Figure 4:
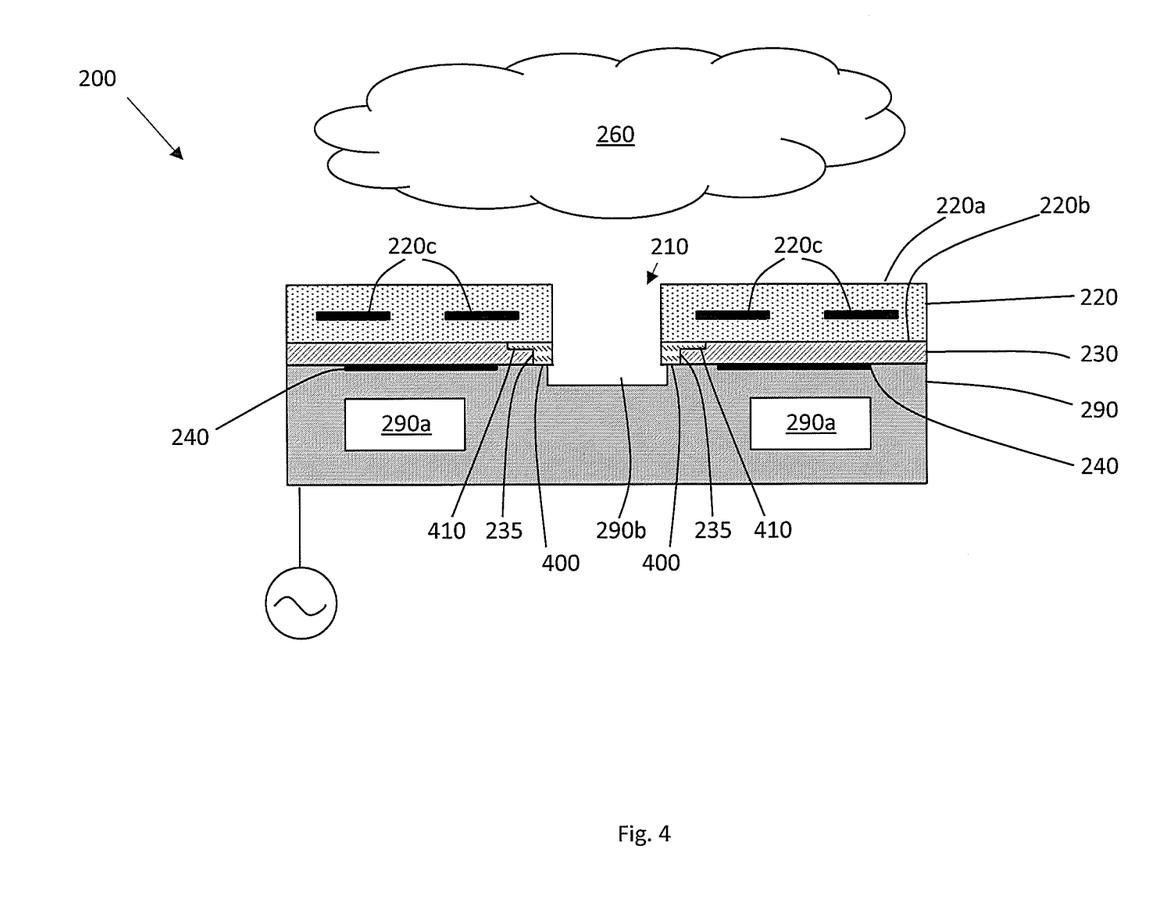
FIG. 4 shows a cross sectional view of a component of a plasma processing chamber, the component having a void space with a sleeve lining an interior surface thereof, according to a second embodiment.

In another embodiment, as shown in FIG. 4, a tubular sleeve 400 is the same as the sleeve 300 except that the sleeve 400 has an upper flange 410. The flange 410 preferably has an upper surface coplanar with an upper surface of layer 230. The sleeve 400 can be mounted in the void space 210 before bonding the layer 220 to layer 230.

Figure 5:
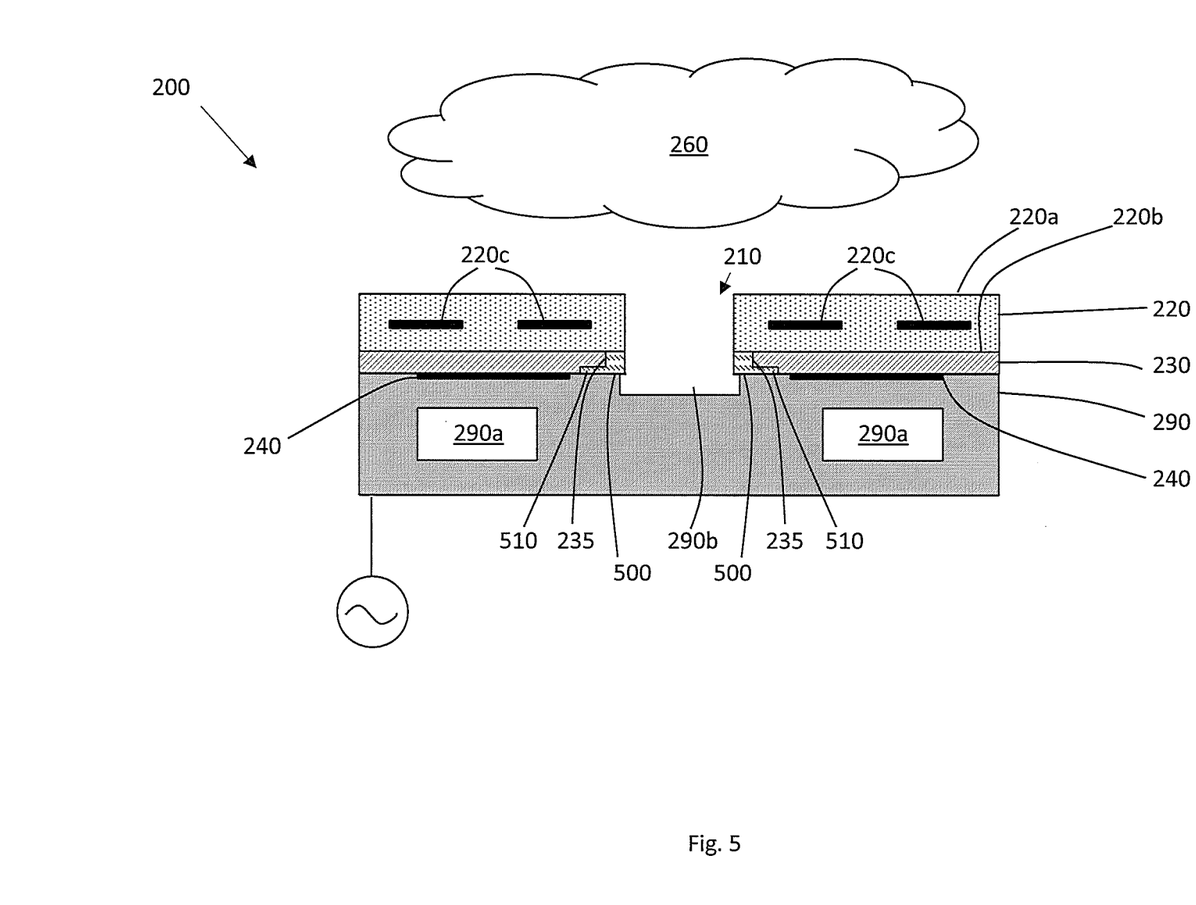
FIG. 5 shows a cross sectional view of a component of a plasma processing chamber, the component having a void space with a sleeve lining an interior surface thereof, according to a third embodiment.

FIG. 5 shows yet another embodiment. A tubular sleeve 500 is the same as the sleeve 300 except that the sleeve 500 has a lower flange 510. In this case, the flange has a lower surface coplanar with a lower surface of layer 230. The sleeve 500 can be mounted in the void space 210 before attaching the base 290 to the layer 230.

The sleeve described herein can also be used in cavities, holes, conduits, voids, plenums and/or other spaces prone to parasitic plasma in a plasma processing chamber. The sleeve can be made into a shape that fits interior conductive surfaces of these spaces. For example, the substrate support 150 can have sleeves in lift pin holes and/or helium passages.

While the sleeve for eliminating parasitic plasma, and the plasma exposed laminate having the sleeve therein have been described in detail with reference to specific embodiments thereof, it will be apparent to those skilled in the art that various changes and modifications can be made, and equivalents employed, without departing from the scope of the appended claims.

We claim:

1. A substrate support of a plasma processing chamber, comprising:
    a first layer of a non-metal material, the first layer having upper and lower surfaces, the upper surface configured to support a substrate thereon during processing of a substrate in the plasma processing chamber;
    a second layer of an electrically conductive material bonded to the lower surface of the first layer;
    a void space extending through the entire first and second layers;
    a tubular sleeve fitted in the void space in the second layer such that the second layer is not exposed in the void space;
    wherein one end of the tubular sleeve is coplanar with facing surfaces of the first layer and the second layer and the other end of the tubular sleeve is coplanar with a lower surface of the second layer and the tubular sleeve has an exposed inner surface with an inner diameter equal to the inner diameter of the void space in the first layer;
    wherein at least one ESC electrode is embedded in the first layer;
    wherein the second layer has a thickness from 0.5 to 5 mm and at least one film heater attached to the lower surface of the second layer; and
    a base plate attached to the lower surface of the second layer wherein the base plate includes embedded fluid channels and is configured to be supplied with RF power during processing of a substrate when the substrate support is installed in the plasma processing chamber.

2. The substrate support of claim 1, wherein the tubular sleeve is made of the same material as the first layer.

3. The substrate support of claim 1, wherein the tubular sleeve is affixed on an interior surface of the void space with threads on an exterior surface of the tubular sleeve.

4. The substrate support of claim 1, wherein the first layer is made of alumina, aluminum nitride, undoped silicon, silicon nitride, silicon oxide, silicon oxynitride and/or yttria.

5. The substrate support of claim 1, wherein the tubular sleeve has an upper outwardly extending flange or a lower outwardly extending flange received in a mating recess in the second layer.

6. The substrate support of claim 1, wherein the tubular sleeve has a wall thickness of at least 0.01 inch.

7. The substrate support of claim 1, wherein a relative permittivity of the electrically conductive material at radio frequencies present in the plasma processing chamber is at least 20 times of a relative permittivity of the non-metal material at the radio frequencies.

8. The substrate support of claim 1, wherein the void is a gas hole, a lift pin hole, a helium passage, a conduit and/or a plenum.

9. The substrate support of claim 1, wherein the second layer is bonded to the lower surface by an adhesive.

10. The substrate support of claim 1, wherein the inner diameter of the void space is from 0.02 to 0.08 inch.

11. The substrate support of claim 1, wherein the base plate has at least one plenum in fluid communication with the void space.

12. The substrate support of claim 1, wherein the base plate is attached to the second layer with a bond, fasteners, or an adhesive.

13. A plasma processing chamber comprising:
a vacuum pump in fluid communication with an interior of the processing chamber that is operable to maintain a desired pressure in the interior of the processing chamber during processing;
a process gas source operable to deliver process gas to the interior of the processing chamber during processing;
an RF source operable to supply RF power to the interior of the processing chamber such that plasma may be generated from the process gas delivered to the interior of the processing chamber during processing; and
the substrate support of claim 1 in the interior of the processing chamber.

14. A method of manufacturing the substrate support of claim 1, comprising:
lining an interior surface of the void space in the second layer with the tubular sleeve such that the second layer is not exposed in the void space and parasitic plasma can be prevented in the void space; and
bonding the second layer to the lower surface of the first layer.

15. The method of claim 14, further comprising attaching the base plate to the lower surface of the second layer.

* * * * *